(12) United States Patent
Chidambarrao et al.

(10) Patent No.: US 8,168,971 B2
(45) Date of Patent: May 1, 2012

(54) PSEUDOMORPHIC SI/SIGE/SI BODY DEVICE WITH EMBEDDED SIGE SOURCE/DRAIN

(75) Inventors: Dureseti Chidambarrao, Weston, CT (US); Anda C. Mocuta, LaGrangeville, NY (US); Dan M. Mocuta, LaGrangeville, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/054,812

(22) Filed: Mar. 25, 2008

(65) Prior Publication Data
US 2008/0179680 A1 Jul. 31, 2008

Related U.S. Application Data

(62) Division of application No. 11/358,483, filed on Feb. 21, 2006, now Pat. No. 7,691,698.

(51) Int. Cl.
*H01L 29/04* (2006.01)
(52) U.S. Cl. .............. 257/49; 438/199; 257/E21.129
(58) Field of Classification Search .......... 257/49, 257/66, 67, 69, 79–84, 103, 195, 265, 441–442, 257/E21.129, E21.131, E21.43, E21.431, 257/E21.633, E21.634, E21.703; 438/199
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |

(Continued)

FOREIGN PATENT DOCUMENTS
JP 64-76755 3/1989

OTHER PUBLICATIONS

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

(Continued)

*Primary Examiner* — Olik Chaudhuri
*Assistant Examiner* — Su Kim
(74) *Attorney, Agent, or Firm* — Joseph P. Abate; Roberts Mlotkowski Safran & Cole, P.C.

(57) ABSTRACT

The invention relates to a semiconductor structure and method of manufacturing and more particularly to a CMOS device with at least one embedded SiGe layer in the source/drain region of the PFET, and at least one embedded SiGe layer in the channel region of the NFET. In one embodiment, the structure of the invention enhances the electron mobility in the NFET device, and further enhances the hole mobility in the PFET device. Additionally, by using the fabrication methods and hence achieving the final structure of the invention, it is also possible to construct a PFET and NFET each with embedded SiGe layers on the same substrate.

20 Claims, 12 Drawing Sheets

U.S. PATENT DOCUMENTS

| | | | |
|---|---|---|---|
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,399,970 B2 * | 6/2002 | Kubo et al. | 257/194 |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,495,402 B1 * | 12/2002 | Yu et al. | 438/149 |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,509,618 B2 | 7/2003 | Jan et al. | |
| 6,621,392 B1 | 9/2003 | Volant et al. | |
| 6,635,506 B2 | 10/2003 | Volant et al. | |
| 6,657,223 B1 | 12/2003 | Wang et al. | |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,838,695 B2 | 1/2005 | Doris et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 7,238,555 B2 | 7/2007 | Orlowski et al. | |
| 7,238,580 B2 | 7/2007 | Orlowski et al. | |
| 2001/0009784 A1 | 7/2001 | Ma et al. | |
| 2002/0011628 A1 * | 1/2002 | Takagi | 257/368 |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2003/0102490 A1 * | 6/2003 | Kubo et al. | 257/192 |
| 2004/0238914 A1 | 12/2004 | Deshpande et al. | |
| 2004/0262784 A1 | 12/2004 | Doris et al. | |
| 2005/0029601 A1 * | 2/2005 | Chen et al. | 257/369 |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0156154 A1 | 7/2005 | Zhu et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2005/0285187 A1 * | 12/2005 | Bryant et al. | 257/335 |
| 2005/0285212 A1 * | 12/2005 | Tolchinsky et al. | 257/408 |
| 2006/0027868 A1 | 2/2006 | Doris et al. | |
| 2006/0057787 A1 | 3/2006 | Doris et al. | |
| 2006/0060917 A1 | 3/2006 | Hayashi et al. | |
| 2006/0060925 A1 | 3/2006 | Doris et al. | |
| 2006/0160291 A1 * | 7/2006 | Lee et al. | 438/199 |
| 2006/0223295 A1 * | 10/2006 | Chen et al. | 438/592 |
| 2006/0237746 A1 * | 10/2006 | Orlowski et al. | 257/192 |
| 2007/0057287 A1 * | 3/2007 | Lin et al. | 257/190 |
| 2007/0138570 A1 | 6/2007 | Chong et al. | |
| 2007/0254423 A1 * | 11/2007 | Chidambarrao et al. | 438/197 |

OTHER PUBLICATIONS

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojuction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

Kern Rim, et al., "Transconductance Enhancement in Deep Submicron Strained-Si *n*-MOSFETs", International Electron Devices Meeting, 26, 8, 1, IEEE, Sep. 1998.

Kern Rim, et al., "Characteristics and Device Design of Sub-100 nm Strained Si N- and PMOSFETs", 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

Office Action dated Jan. 22, 2009, in U.S. Appl. No. 11/358,483.
Office Action dated Apr. 3, 2009, in U.S. Appl. No. 11/358,483.
Office Action dated Mar. 25, 2008 in U.S. Appl. No. 11/358,483.
Final Office Action dated Oct. 21, 2008 in U.S. Appl. No. 11/358,483.
Notice of Allowance dated Nov. 19, 2009 in U.S. Appl. No. 11/358,483.

* cited by examiner

PSEUDOMORPHIC SI/SIGE/SI BODY DEVICE WITH EMBEDDED SIGE SOURCE/DRAIN

CROSS REFERENCE TO RELATED APPLICATIONS

The present application is a divisional application of U.S. application Ser. No. 11/358,483 filed on Feb. 21, 2006 now U.S. Pat. No. 7,691,698, the contents of which are incorporated by reference in their entirety.

FIELD OF THE INVENTION

The invention relates generally to a semiconductor device and method of manufacturing, and more particularly to a semiconductor device and method of manufacturing an NFET and PFET device with stress components.

BACKGROUND DESCRIPTION

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the NFETs and/or PFETs. But, it is well known that stress components affect the behaviors NFET and PFET devices differently.

In order to maximize the performance of both NFETs and PFETs within integrated circuit (IC) chips, the stress components should be engineered and applied differently for NFETs and PFETs. The stress components should be engineered and applied differently because the type of stress which is beneficial for the performance of an NFET is generally disadvantageous for the performance of the PFET. More particularly, when a device is in tension, the performance characteristics of the NFET is enhanced while the performance characteristics of the PFET is diminished.

To accommodate the different stress requirements, it is known to use different material combinations to apply tensile stress to NFETs and compressive stress to PFETs. In known processes for implementing stresses in FETs, distinct processes and/or materials are used to create the tensile or compressive stresses in the NFETs and PFETs, respectively. It is known, for example, to use a trench isolation structure for the NFET and PFET devices. According to this method, the isolation region for the NFET device contains a first isolation material which applies a first type of mechanical stress on the NFET device in a longitudinal direction and in a transverse direction. Further, a first isolation region and a second isolation region are provided for the PFET and each of the isolation regions of the PFET device applies a unique mechanical stress on the PFET device in the transverse direction.

Additional methods to provide strain for both NFET and PFET include the use of patterned, tensile or compressively strained silicon nitride layers for spacers or gate sidewalls, or for contact studs etch stop liners.

While these methods do provide structures that have tensile stresses being applied to the NFET device and compressive stresses being applied along the longitudinal direction of the PFET device, they require additional materials and/or more complex processing, and thus, result in higher cost. Also, the levels of induced stress with these methods tend to saturate and also become lower with technology scaling. Further, in current fabrication devices, a method and device including both NFET and PFET devices on the same substrate including an embedded SiGe layer in the gate region of the NFET, and an embedded SiGe layer in the PFET source/drain region are preferred during separate processes. These more recent methods provide strained channel NFET and PFET where the stresses increase with further gate length scaling and are not/little impacted by overall design ground rules scaling.

SUMMARY OF THE INVENTION

In a first aspect, the invention provides a method of fabricating a semiconductor device, including forming stress inducing layers under a first gate structure, protecting portions of the stress inducing layers under the first gate structure, protecting a second gate structure having a stress component associated therewith, etching unprotected areas of the stress inducing layers at sides of the first gate structure to form openings and a resulting stress component under the first gate structure, and filling the openings with material.

In a second aspect, the invention provides a semiconductor device structure including a substrate, first and second gate stacks disposed on the substrate, the first gate stack comprising at least one silicon layer, and a source/drain region adjacent to the first gate stack comprising a compressive inducing material to place the first gate stack in a compressive state, the second gate stack comprising a first silicon layer disposed on the substrate, and a tensile producing material disposed on the first silicon layer, and a second silicon layer disposed on the tensile producing material to induce a tensile stress component under the second gate stack.

A third aspect of the invention is a semiconductor device structure including a NFET device and a PFET device disposed on a substrate, the PFET device comprising a first gate stack, the NFET device comprising a second gate stack, wherein the first gate stack comprises at least one silicon layer and an adjacent source/drain region which comprises at least one silicon germanium layer to induce a compressive stress, and wherein the second gate stack comprises at least one silicon layer formed on a silicon germanium layer to induce a tensile stress.

DETAILED DESCRIPTION OF EMBODIMENTS OF THE INVENTION

The invention relates to a semiconductor structure and method of manufacturing and more particularly to a CMOS device with at least one embedded SiGe layer in the source/drain region of the PFET, and at least one embedded SiGe layer in the channel region of the NFET. In one embodiment, the structure of the invention enhances the electron mobility in the NFET device, and further enhances the hole mobility in the PFET device. Additionally, by using the fabrication methods and hence achieving the final structure of the invention, it is possible to construct a compressively strained channel PFET and a tensile strained channel NFET on the same substrate, in same processing steps.

Figure 1:
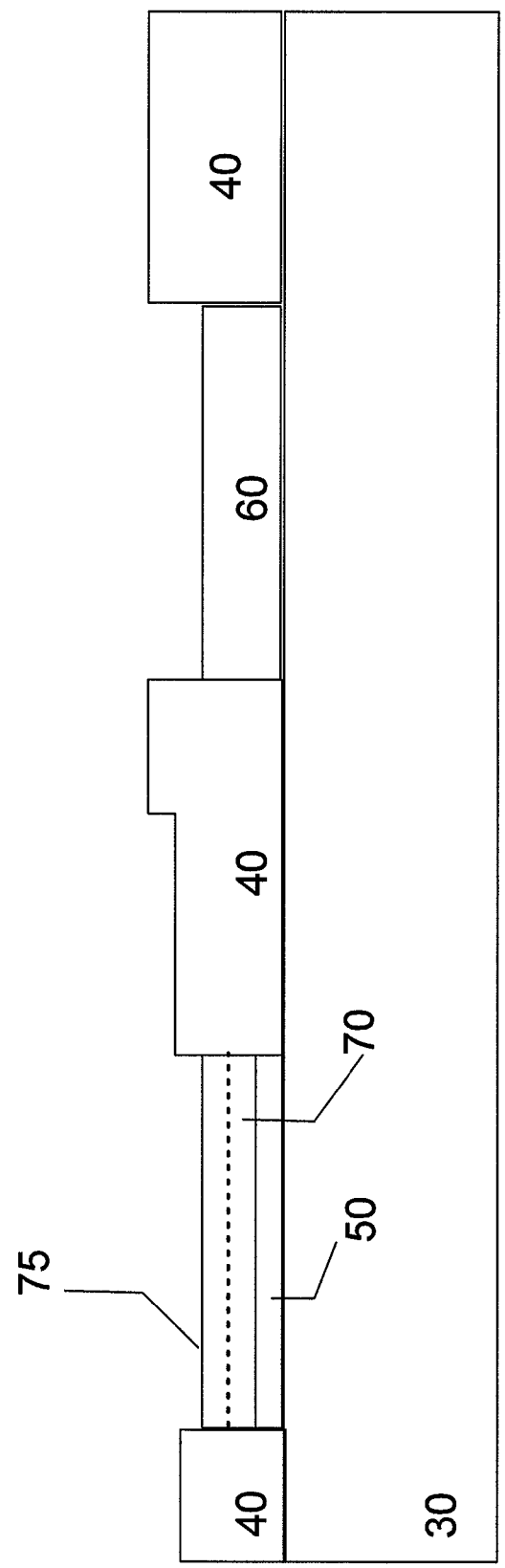
FIGS. 1 through 12 are representative of sectional schematic views of processing step(s) and structures in accordance, with the invention (not to scale).

Referring to FIG. 1, an exemplary initial structure is shown. Specifically, the exemplary initial structure is comprised of an NFET region 10 and a PFET region 20 formed on a substrate 30. The substrate 30 can be any conventional substrate, for example, a buried oxide (BOX), or a conventional bulk type Si wafer or substrate.

Next, isolation areas 40 are formed to isolate the NFET region 10 and the PFET region 20. Any conventional isolation scheme can be used to isolate the NFET region 10 and the PFET region 20 on the substrate 30. The isolation methods include, for example, shallow trench isolation (STI), or any variation of the local isolation of silicon (LOCOS) method, as is well known and understood in the art. Thus, although the exemplary structure of FIGS. 1-12 uses shallow trench isolations (STIs) 40, any isolation structure is contemplated by the present invention.

In one illustrative technique to form the STIs 40, photoresist is formed on the substrate, patterned, and a trench is etched in a conventional manner. The trench may be filled with an oxide, for example, by chemical vapor deposition (CVD) techniques. The surface can then be planarized, such as by chemical mechanical polishing.

In an embodiment involving SOI substrates, the thickness of the layers 50 and 60 at the starting wafer level is approximately 500 Å, although other thicknesses are contemplated by the invention depending on the parameters and design characteristics of the final device. Regardless of the starting substrate (SOI or bulk silicon), NFET region 10 is recessed first by a silicon etch, while the PFET region 20 is protected from this etch, by a hard mask layer such as silicon nitride. The recess depth is approximately 300 Å, although other depths are contemplated by the invention depending on the parameters and design characteristics of the final device.

Following the recess of the NFET region 10, at least one pseudomorphic SiGe layer 70 is formed on the silicon or SOI layer 50 in the NFET region 10, followed by another silicon layer 75. In embodiments, the at least one pseudomorphic SiGe layer 70 is approximately 200 Å thick and the silicon layer 75 is approximately 100 Å thick; although other thicknesses are contemplated by the invention depending on the parameters and design characteristics of the final device.

The at least one pseudomorphic SiGe layer 70 is selectively formed in a conventional manner via epitaxial deposition, for example, using ultrahigh-vacuum chemical vapor deposition (UHVCVD), low pressure chemical vapor deposition (LPCVD), rapid thermal chemical vapor deposition (RTCVD), and low energy plasma enhanced chemical vapor deposition (LEPECVD). In embodiments, the amount of Ge in the SiGe layer 70 is approximately 20%; although other percentages are also contemplated by the invention, with the realization that higher concentrations will provide higher stress levels for the NFET device.

The exemplary embodiment of FIG. 1 further shows a silicon layer 75 formed on the at least one pseudomorphic SiGe layer 70. The deposition of the silicon layer 75 may be deposited in a conventional manner via any selective epitaxial silicon formation technique. The deposition of the silicon layer 75 can be performed in the same process step as the deposition of the pseudomorphic SiGe layer 70.

It should be understood that since Si has a smaller lattice constant (i.e., atom spacing) than Ge, when the Si layer 75 is grown on the at least one SiGe layer 70, the Si layer 75 will become strained in tension with further processing steps. As will be described further, the SiGe layer 70 will become strain relaxed and thus inducing tensile strain into the Si layer 75. A suitable thickness for the strained Si layer 75 is below the critical thickness, which is the maximum thickness that strained Si can grow on the at least one relaxed SiGe layer 70 without forming defects in the crystal structure (e.g., dislocations). By way of example but not limitation, the strained Si layer 75 is between approximately 100 Å and 200 Å thick, and more preferably approximately 100 Å. The use of the Si layer 75 and SiGe layer 70, e.g., stress inducing layers, may be used to place the NFET under a tensile stress as discussed in greater detail below.

Figure 2:
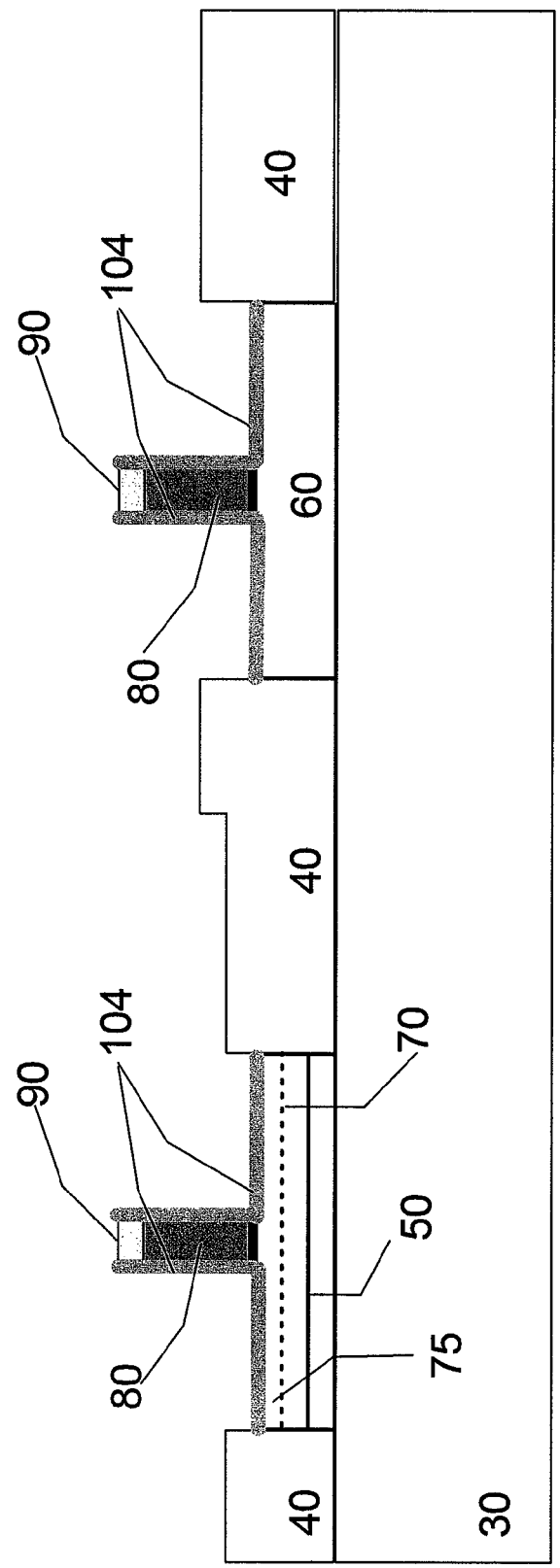

FIG. 2 shows a polysilicon gate patterning process in accordance with the invention. In this process, a polysilicon gate 80 is patterned in both the NFET region 10 and the PFET region 20 by conventional patterning processes, which includes deposition of a silicon nitride layer acting as a hard mask and lithography and etching steps. By way of example, the lithography step entails applying a photoresist, exposing the photoresist to a pattern of radiation, and developing the pattern utilizing a conventional resist developer. Following the lithography step, a conventional etching process such as reactive-ion etching, plasma etching, ion beam etching or laser ablation may be employed in transferring the pattern to active areas of the NFET region 10 and PFET region 30 to form the polysilicon gates 80 in the NFET region 10 and PFET region 20. A SiN cap 90 will remain on the gate region. A reoxidation process is used to grow a thin oxide 104 on the gate sidewall as well as on the remaining exposed source/drain regions.

Figure 3:
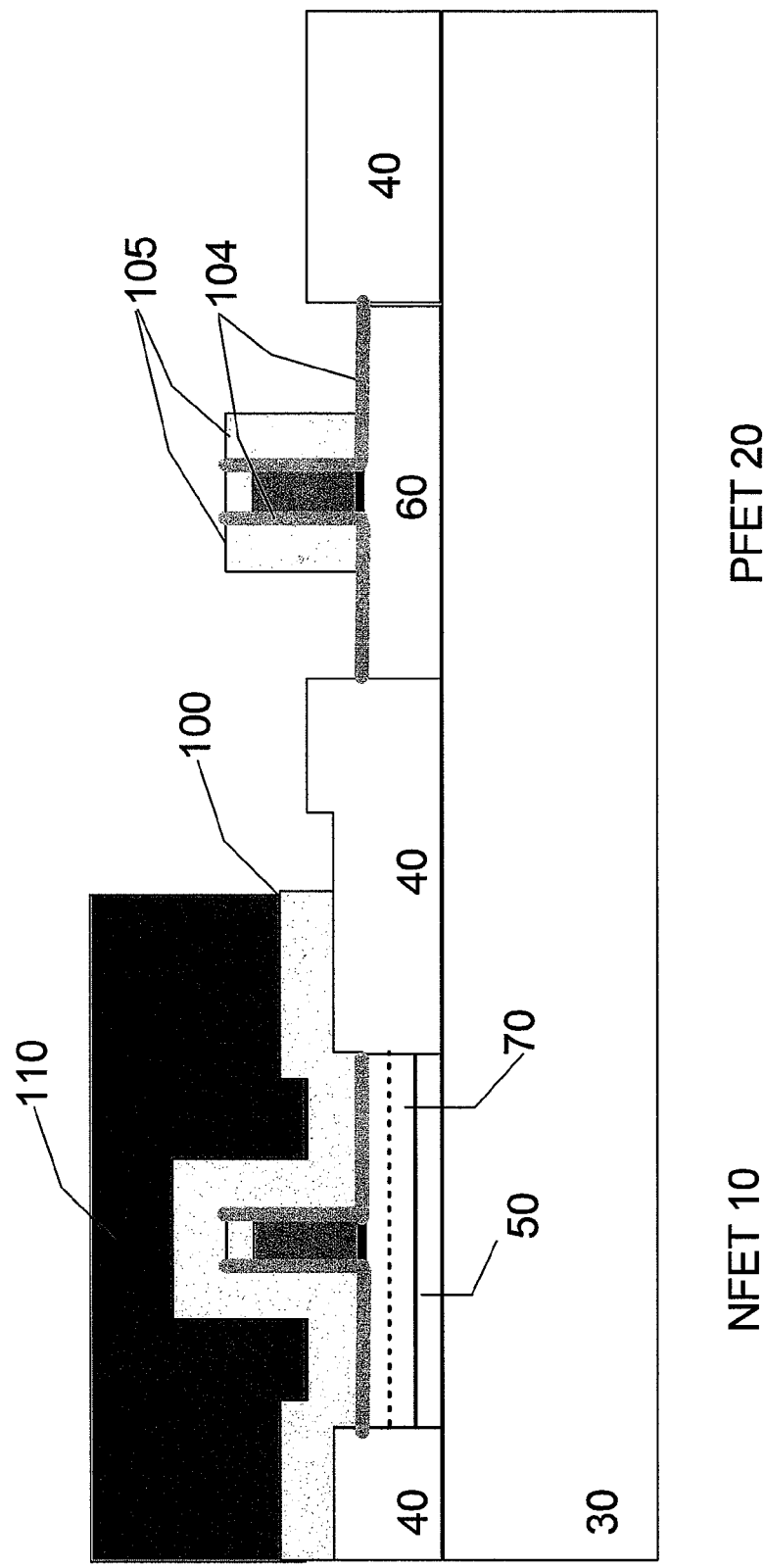

FIG. 3 represents the step of forming a sacrificial spacer 105 along the PFET gate sidewalls. In this processing, a sacrificial block material is deposited on the structure. In one embodiment, the sacrificial block material is a nitride material (e.g., $Si_3N_4$) and forms nitride layer 100, and is formed in a conventional manner, such as by chemical vapor deposition (CVD) using a silane source. Other techniques which may be suitable for forming a nitride layer include LPCVD and atmospheric pressure CVD (APCVD).

A photoresist mask 110 is then formed over the NFET region 10. Portions of the nitride layer 100 are subsequently etched in a conventional manner in the PFET region 20 to form sacrificial spacers 105. In embodiments, the spacers 105 are approximately 200 Å thick. Etching of the nitride layer 100 in the PFET region 20 can be performed for example, using anisotropic reactive ion etching (RIE).

Figure 4:
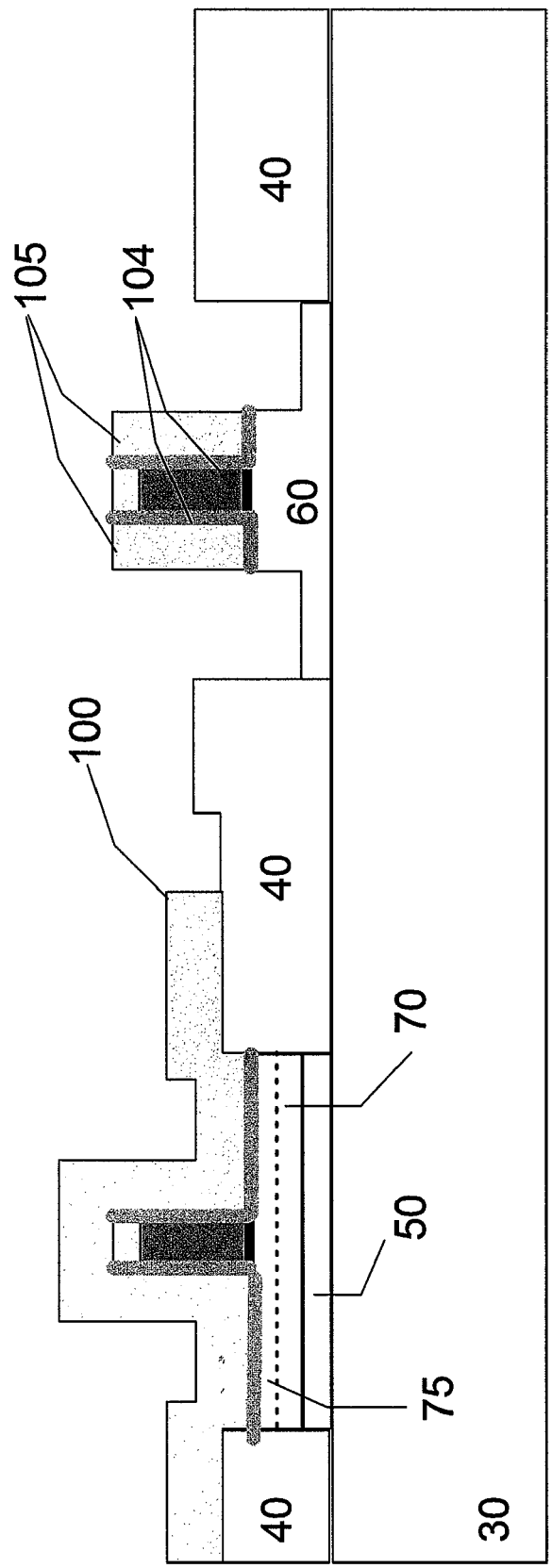

As shown in exemplary FIG. 4, after formation of the sacrificial spacer 105 along the PFET gate sidewalls, the photoresist mask 110 (shown in FIG. 3) is removed from the NFET region 10, using conventional stripping methods known in the art. After the photoresist mask 110 is removed, the silicon or SOI layer 60 is partially etched using a conventional anisotropic silicon etching process. In embodiments, the silicon or SOI layer 60 is etched to form a trench of approximately 300 Å, although the etching depth can vary depending on the stress tailoring needs.

Figure 5:
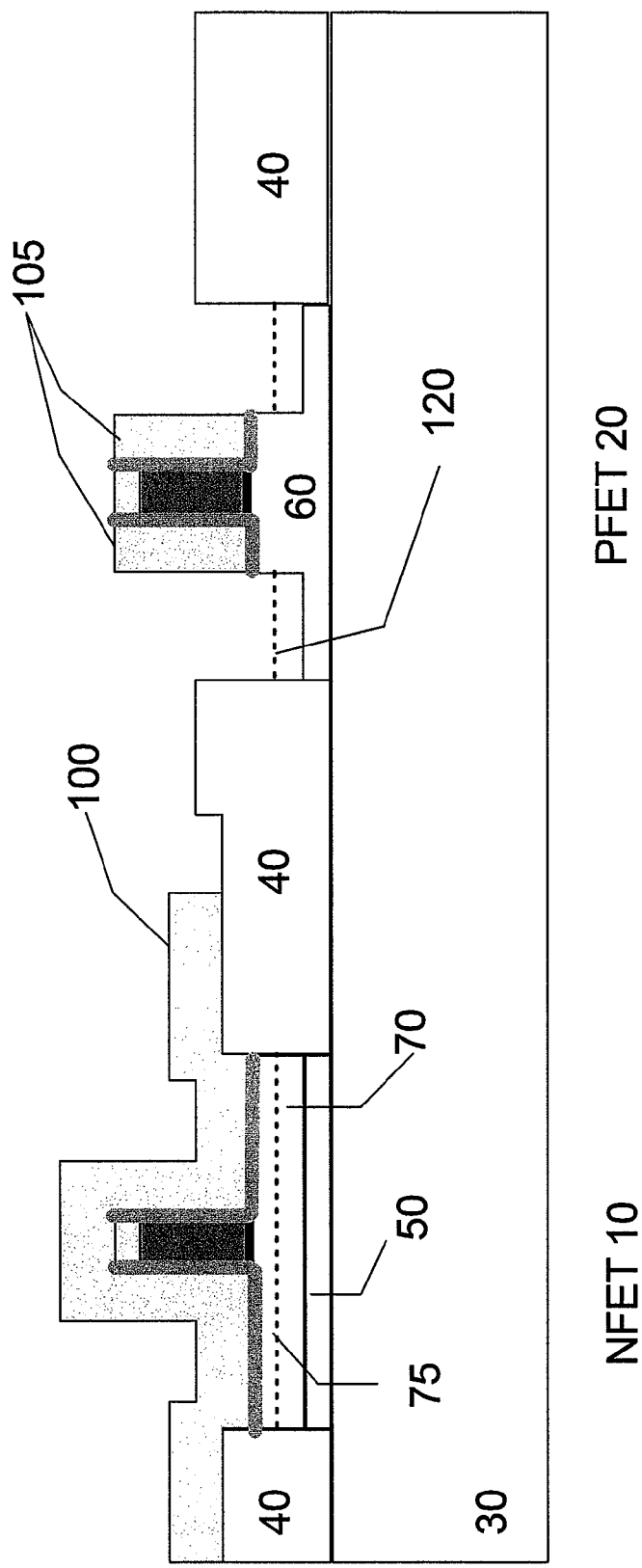

Referring to FIG. 5, an SiGe layer 120 is formed in the openings of the etched silicon or SOI layer 60 in the PFET region 20. In embodiments, the SiGe layer 120 is between approximately 300 Å and 500 Å thick, although other thicknesses can also be used depending on the depth of the etched area and of the intended overfill of the trench. The SiGe layer 120 can be selectively formed epitaxially in any conventional manner, for example, using UHVCVD, MBE, LPCVD, RTCVD, and LEPECVD, as noted above. The SiGe layer 120 will place the PFET device in a compressive state thus enhancing hole mobility.

Figure 6:
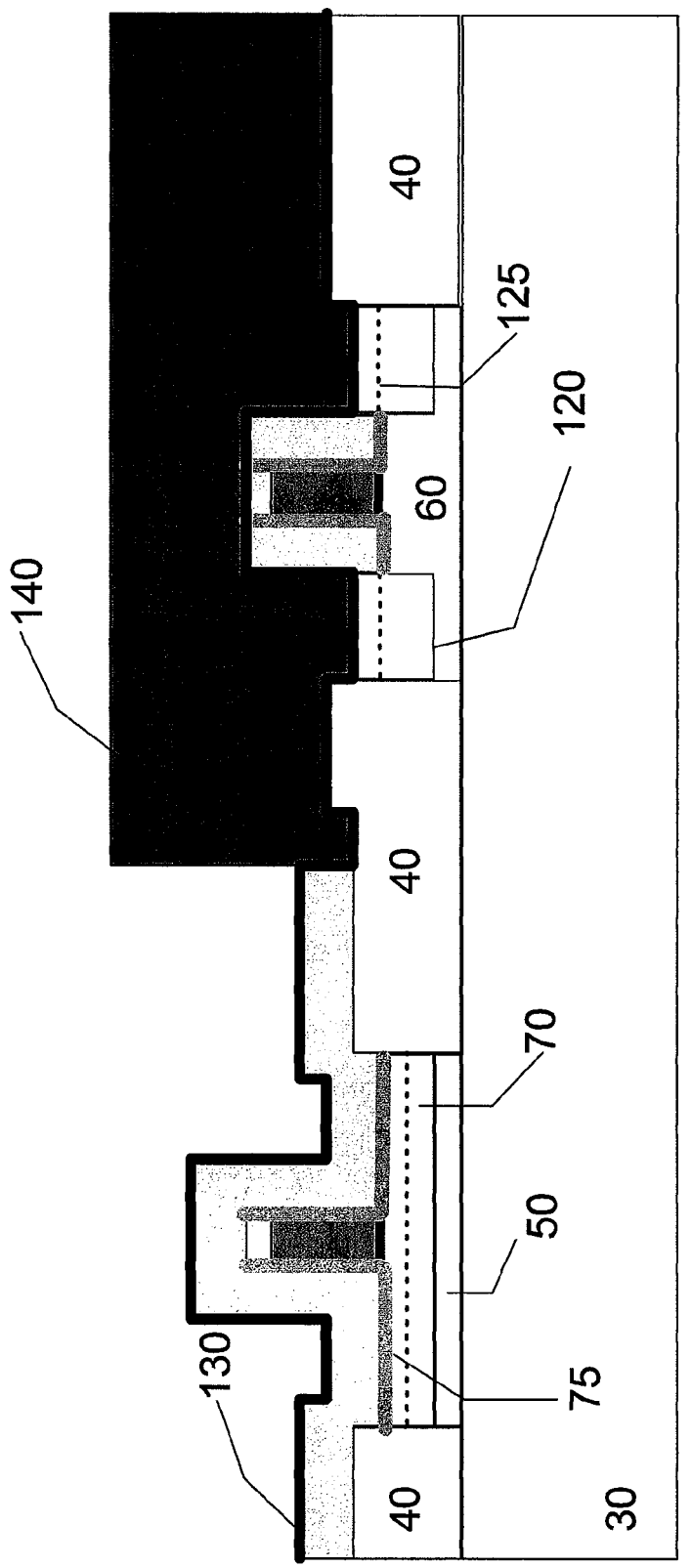

Referring to FIG. 6, although not required, the exemplary embodiment may include a silicon layer 125 formed on the SiGe layer 120. The silicon layer 125 may be formed in any conventional manner to allow better silicide formation.

Referring still to FIG. 6, a liner 130 made of an oxide or nitride based material, for example $SiO_2$, is formed on the NFET region 10 and PFET region 20. In one embodiment, the liner is in the range of between approximately 20 Å and 50 Å thick.

A blocking mask material 140 is then formed on the PFET region 20 in order to perform a conventional etching process on the liner 130 in the NFET region 10. The purpose of the liner material is to protect the PFET areas during the selective epitaxial growth step that follows. The thickness of the liner 130 is not critical to the understanding of the invention and accordingly any thickness that provides a suitable protection of the PFET region 20 from the epitaxial growth on the NFET is contemplated.

Figure 7:
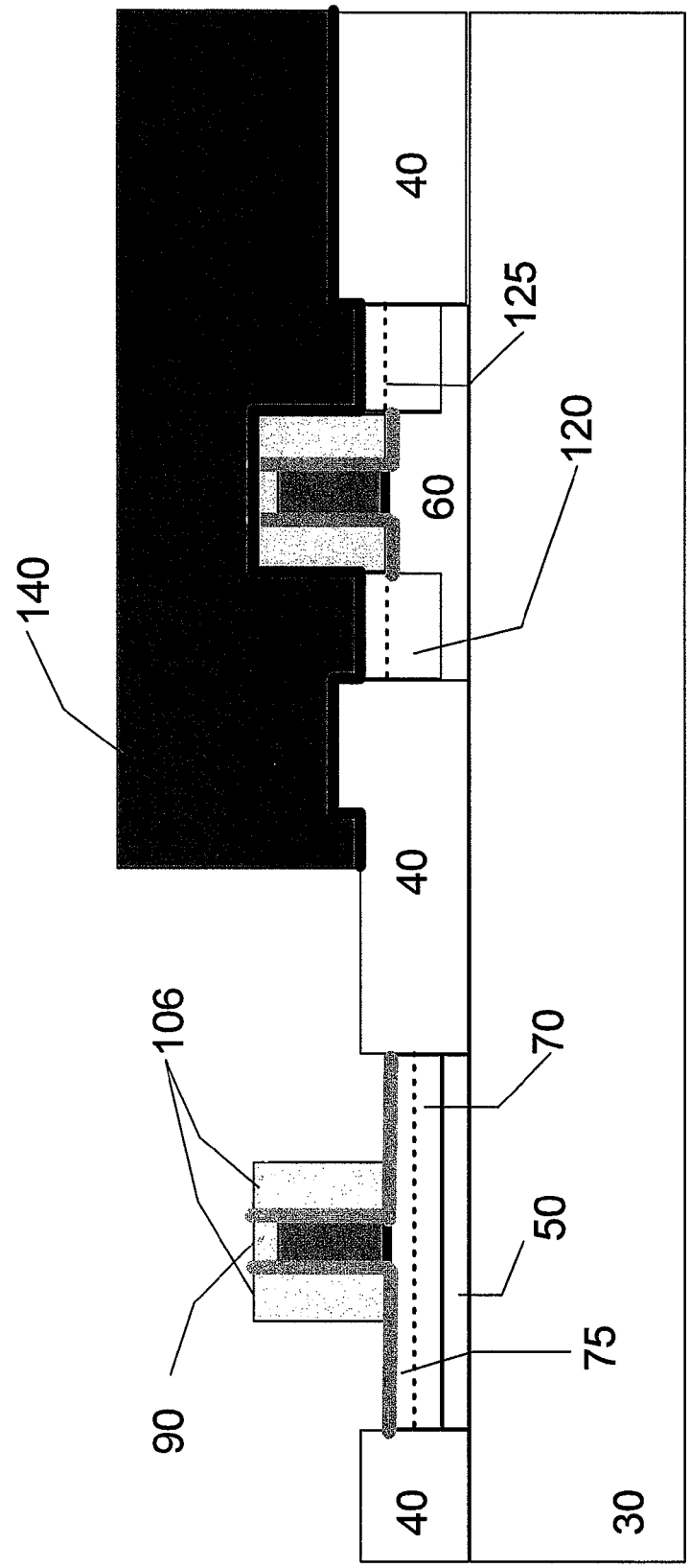

Referring now to FIG. 7, the liner 130 and portions of the nitride layer 100 are removed from the NFET region 10 by anisotropic reactive ion etching (RIE) until the SiN cap 90 is reached, thereby forming sacrificial spacers 106 along the gate sidewalls in the NFET region 10.

Figure 8:
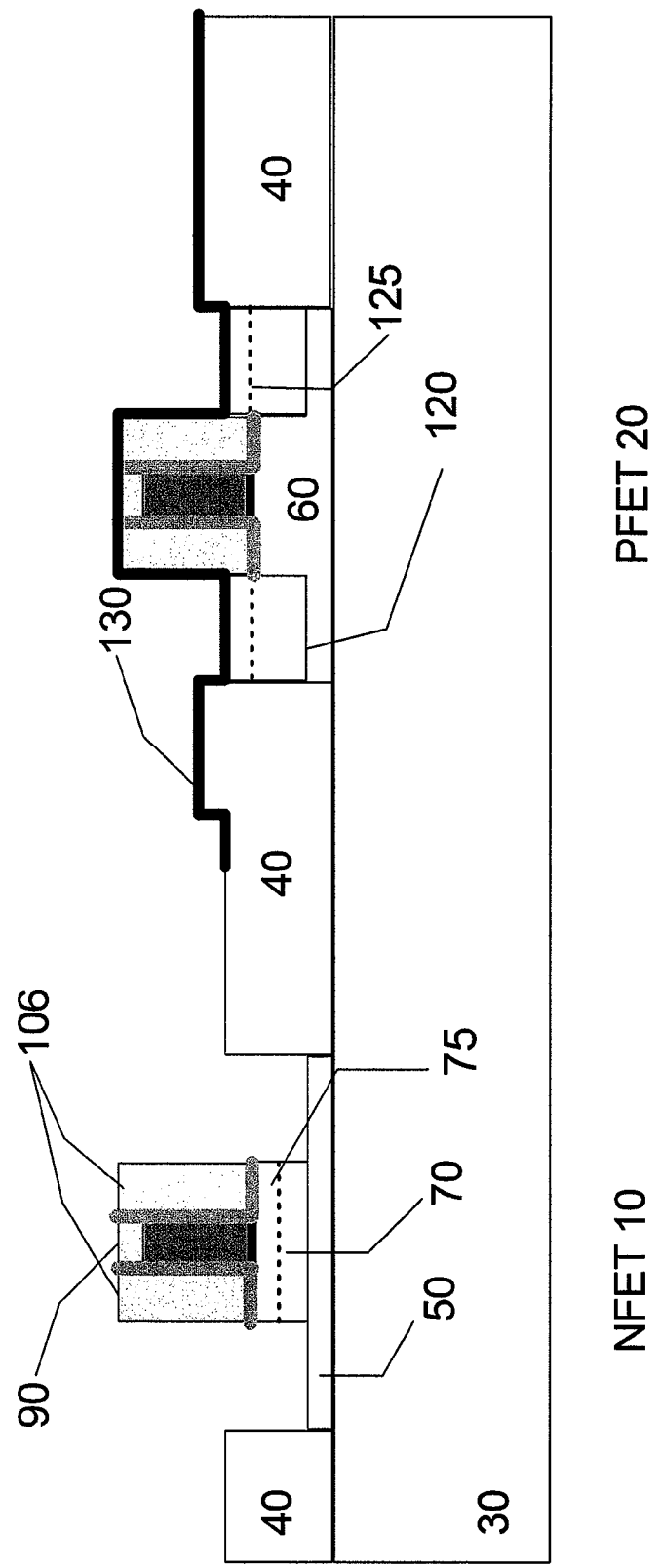

Referring to FIG. 8, the blocking mask material 140 in the PFET region 20 is removed using conventional processes. In further processing steps, the pseudomorphic SiGe layer 70 and Si layer 75 which are not protected by the sacrificial spacers 106, are removed by anisotropic reactive ion etching (RIE). This leaves portions of the silicon or SOI layer 50 exposed. The SiGe layer 70 that was initially pseudomorphic to the Si substrate can now relax elastically by expanding laterally. As such, the Si layer 75 under the gate becomes strained in a tensile stress. The tensile stress of the Si layer 75 thus increases the electron mobility under the gate of the NFET region 10. Thus, the increased electron mobility under the gate of the NFET allows increased NFET performance at the same time with increased PFET performance.

Figure 9:
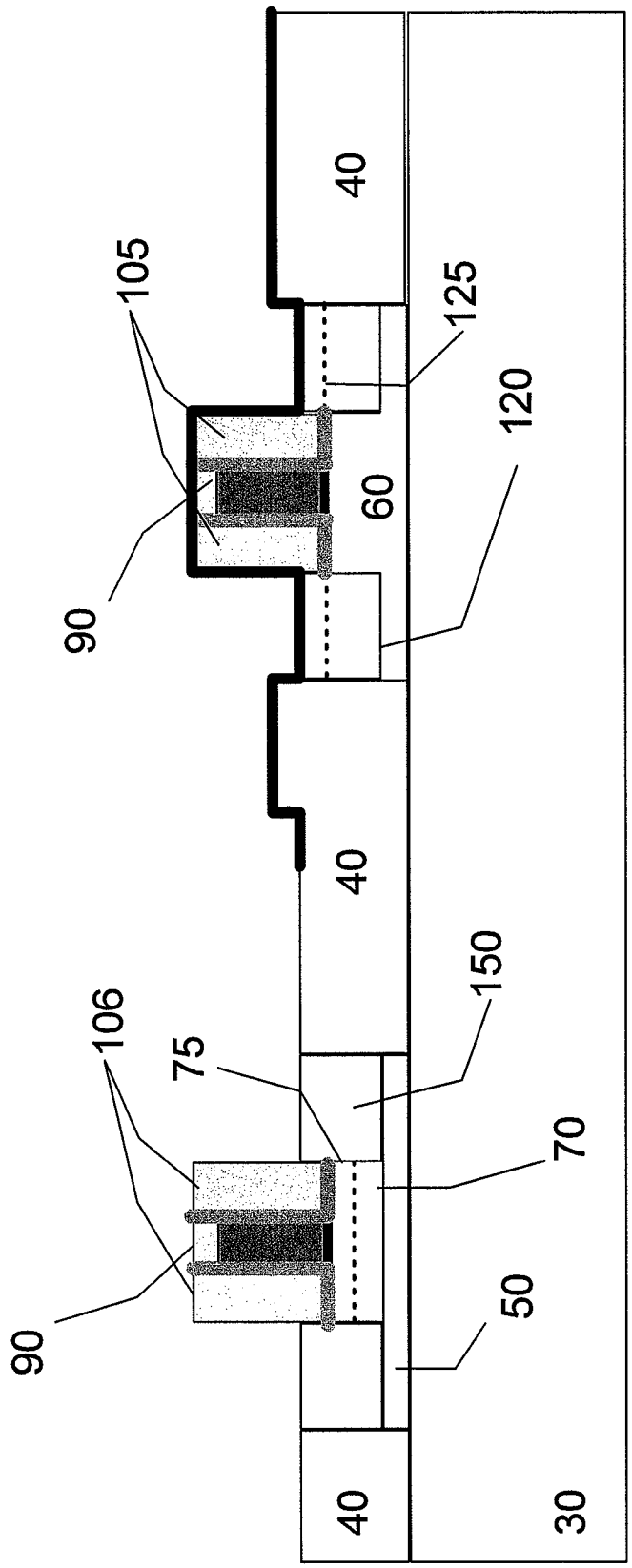

Referring now to FIG. 9, a silicon raised source/drain 150 is selectively formed epitaxially onto exposed portions of the silicon or SOI layer 50 of the NFET region 10. As noted above, epitaxial formation of the silicon raised source/drain 150 can be performed by any conventional process, for example by UHVCVD, LPCVD, RTCVD, and LEPECVD. In one embodiment, the thickness of the silicon raised source/drain is between approximately 300 Å and 500 Å, depending on the specific device characteristics.

Figure 10:
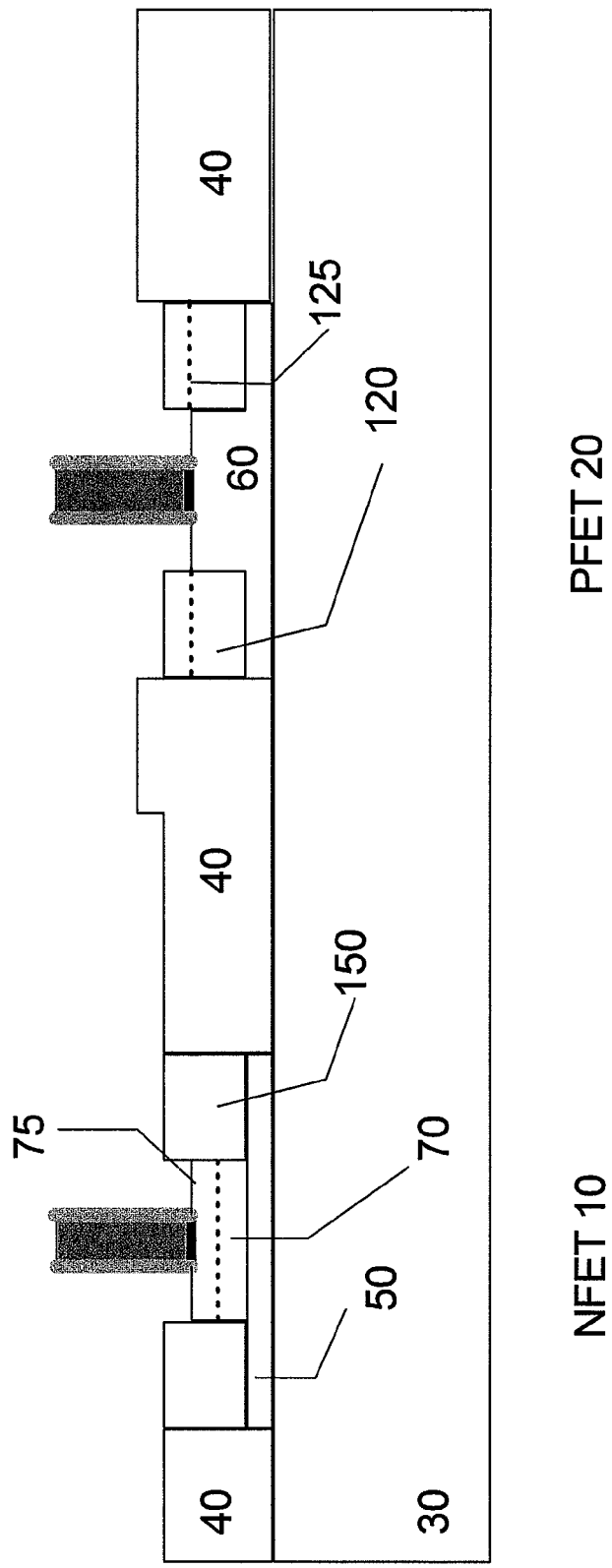

Referring to FIG. 10, liner 130, sacrificial spacers 105 and 106, and SiN caps 90 (all shown in FIG. 9) are removed by conventional dry or wet etching chemistry. For example, wet etch methods include use of a dilute hydrofluoric acid mixture optionally with glycerol, or hot phosphoric acid. Alternatively, dry etch methods include $C_4F_8$ chemistry, or plasma etch including $CHF_3$ and $CF_4$, depending on the material and desired etching depth, as is well known in the art.

Figure 11:
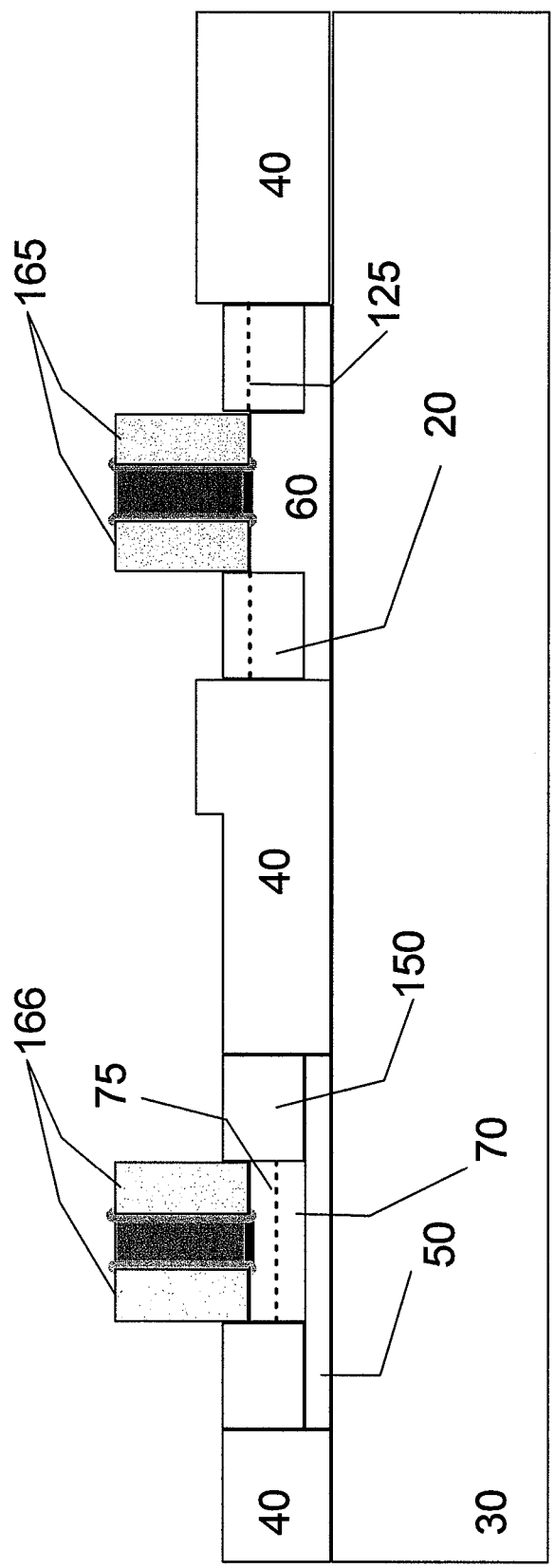
Figure 12:
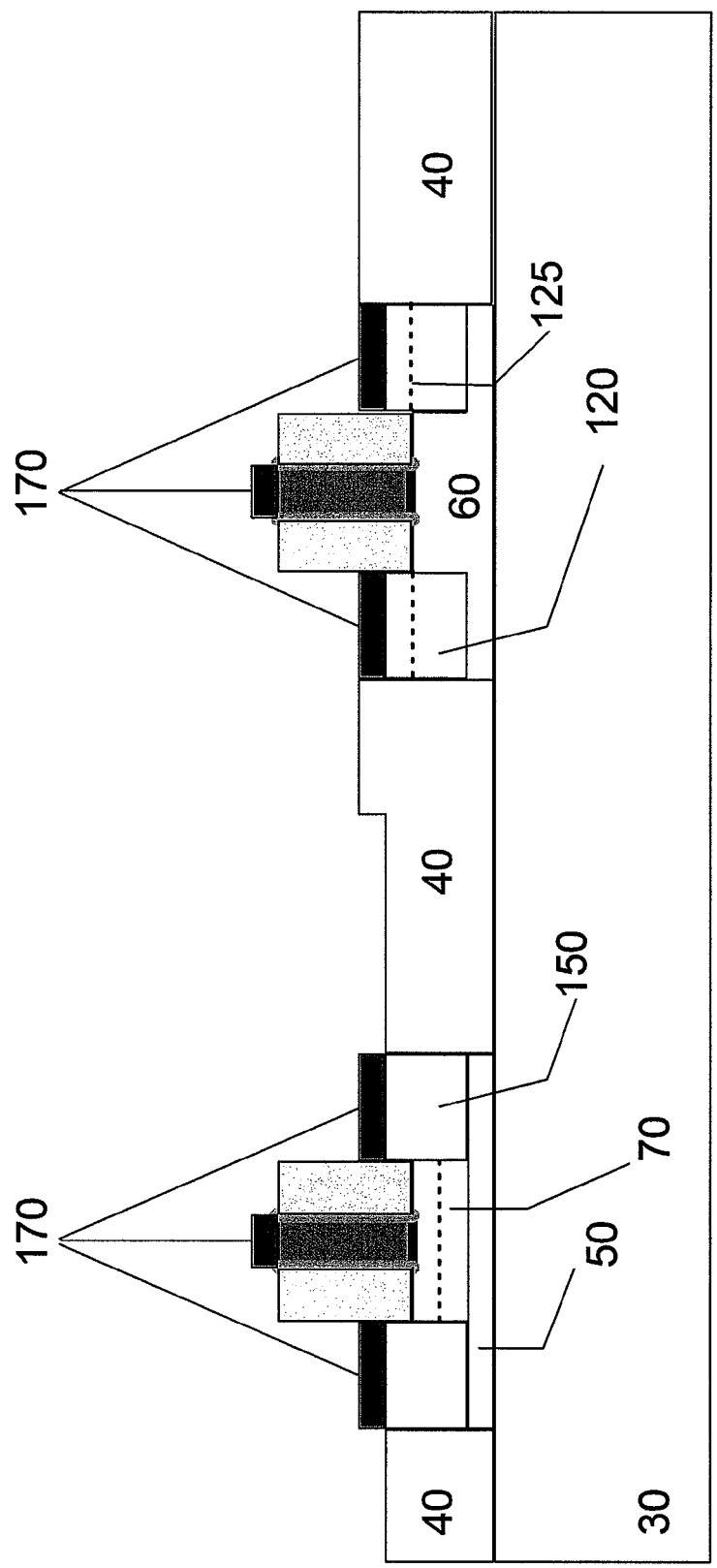

FIGS. 11 and 12 show conventional processing steps performed to complete the device structure in accordance with an implementation of the invention. NFET and PFET extensions and halo implantation are performed, followed by with source/drain spacer formation 165 and 166, NFET and PFET source/drain implantations and final activation anneal. More specifically, the source/drain spacers 165 and 166 may be formed by, for example, deposition of a nitride material (e.g., $Si_3N_4$) deposited in a conventional manner, such as by chemical vapor deposition (CVD) using a silane source. Interconnect build-up using conventional wiring materials such as Cu can also be performed.

Extension implant of the NFET and PFET can be performed for example, by implantation of a dopant such as arsenic or boron ($BF_2$), respectively. In one embodiment, the implantation energy is about 1 KeV to 5 KeV, and dosage of the implantation may range from about 5e14 to 3e15 ions per $cm^2$. Halo implantation of the NFET and PFET can be performed for example, by implantation of a dopant such as arsenic or boron ($BF_2$), respectively. In one embodiment, the implantation energy is about 5 KeV to 50 KeV, and dosage of the implantation may range from about 1e13 to 3e14 ions per $cm^3$.

Referring now to FIG. 12, a salicide process forms salicide areas 170. As is well known in the art, a self-aligned silicide process is performed wherein silicide contacts are formed only in those areas in which deposited metal (which after annealing becomes a metal component of the silicide) is in direct contact with silicon, whereby ohmic contacts to the source, drain, and gate are formed to produce salicide areas 170 in the NFET region 10 and PFET region 20. Following the salicide process, an interconnect build-up using conventional wiring materials such as Cu (not shown) can be performed in preparation for subsequent processing steps.

While the invention has been described in terms of embodiments, those skilled in the art will recognize that the invention can be practiced with modifications and in the spirit and scope of the appended claims.

What is claimed is:

1. A semiconductor device structure, comprising:
a substrate;
first and second gate stacks disposed on the substrate;
the first gate stack comprising at least one silicon layer, and a source/drain region adjacent to the first gate stack, the source/drain region comprising a compressive inducing material to place the first gate stack in a compressive state;
the second gate stack comprising a first silicon layer disposed on the substrate, and a tensile producing material disposed on the first silicon layer, a second silicon layer disposed on the tensile producing material to induce a tensile stress component under the second gate stack, and silicon raised source/drain regions contacting the first silicon layer, the second silicon layer and the tensile producing material, wherein the tensile producing material is a SiGe layer forming part of the second gate stack.

2. The device of claim 1, wherein the substrate comprises at least one of a silicon-on-insulator substrate and a buried oxide layer substrate.

3. The device of claim 1, wherein the second gate stack further comprises a polysilicon gate disposed on the second silicon layer.

4. The device of claim 1, wherein the compressive inducing material is SiGe material disposed laterally beside sidewalls of an SOI layer.

5. The device of claim 1, wherein:
the at least one silicon layer is formed directly on the substrate, and
the compressive inducing material is SiGe material disposed vertically above a first portion of the at least one silicon layer and laterally beside a second portion of the at least one silicon layer.

6. The device of claim 5 wherein:
the first silicon layer is disposed directly on the substrate,
the SiGe layer is disposed directly on the first silicon layer, and
the second silicon layer is disposed directly on the SiGe layer.

7. The structure as claimed in claim 1, wherein an interface between the SiGe layer and the first silicon layer is at a same level as an interface between the first silicon layer and a bottom surface of NFET source/drain regions disposed on the first silicon layer.

8. The structure as claimed in claim 1, further comprising:
a polysilicon gate formed on the at least one silicon layer, wherein the at least one silicon layer is formed directly on the substrate; and at least one of oxide and nitride spacers arranged laterally beside the polysilicon gate and on an upper surface of and contacting the at least one silicon layer.

9. The device of claim 1, wherein the compressive inducing material is SiGe disposed in openings of an underlying SOI layer adjacent to active areas of the first gate stack.

10. A semiconductor device structure, comprising:
a NFET device and a PFET device disposed on a substrate;
the PFET device comprising a first gate stack;
the NFET device comprising a second gate stack;
wherein the first gate stack comprises at least one PFET silicon layer and an adjacent source/drain region, the source/drain region comprising at least one SiGe layer to induce a compressive stress and a source/drain silicon layer directly on the at least one SiGe layer; and
wherein the second gate stack comprises at least one NFET silicon layer formed on a SiGe layer to induce a tensile stress.

11. The structure as claimed in claim 10, wherein the substrate comprises at least one of a silicon-on-insulator substrate, and a buried oxide layer substrate.

12. The structure as claimed in claim 10, wherein the second gate stack further comprises silicon material on sides thereof to form source/drain regions.

13. The structure as claimed in claim 10, wherein:
the at least one PFET silicon layer comprises an SOI layer, and
the at least one SiGe layer to induce a compressive stress is disposed laterally beside sidewalls of the SOI layer.

14. The structure as claimed in claim 10, wherein:
the at least one PFET silicon layer is formed directly on the substrate, and
the at least one SiGe layer to induce a compressive stress comprises SiGe disposed vertically above a first portion of the at least one PFET silicon layer and laterally beside a second portion of the at least one PFET silicon layer.

15. The structure as claimed in claim 14 wherein:
the second gate stack comprises a first silicon layer disposed directly on the substrate,
the SiGe layer to induce tensile stress comprises SiGe disposed directly on the first silicon layer, and
the at least one NFET silicon layer is disposed directly on the SiGe layer to induce tensile stress.

16. The structure as claimed in claim 14, further comprising:
a gate formed on the at least one PFET silicon layer; and
at least one of oxide and nitride spacers arranged laterally beside the gate and on an upper surface of and contacting the at least one PFET silicon layer.

17. The structure as claimed in claim 10, further comprising:
a first silicon layer disposed on the substrate; and
NFET source/drain regions disposed on the first silicon layer,
wherein the SiGe layer to induce tensile stress is disposed on the first silicon layer, and
a bottom surface of the SiGe layer to induce tensile stress is at a same level as a bottom surface of the NFET source/drain regions.

18. The structure as claimed in claim 10, wherein the NFET device comprises silicon source/drain regions beside both the SiGe layer and the at least one NFET silicon layer.

19. A semiconductor device structure, comprising:
a PFET device comprising:
a PFET silicon layer including a central upper surface and lateral upper surfaces, wherein the PFET silicon layer is formed directly on a substrate and the central upper surface is higher than the lateral upper surfaces;
PFET source/drain regions comprising a first layer contacting the lateral upper surfaces of the PFET silicon layer and a first silicon layer contacting an upper surface of the first layer, wherein the first layer is composed of a material that induces compressive stress in a central portion of the PFET silicon layer;
a gate disposed on the PFET silicon layer; and
at least one of oxide and nitride spacers arranged laterally beside the gate and contacting the PFET silicon layer; and
an NFET device comprising:
an NFET silicon layer formed directly on the substrate;
a layer of tensile stress producing material disposed directly on the NFET silicon layer;
a second silicon layer disposed directly on the a layer of tensile stress producing material;
NFET source/drain regions comprising silicon contacting the NFET silicon layer, wherein a bottom surface of the layer of tensile stress producing material is at a same level as a bottom surface of the silicon of the NFET source/drain regions.

20. The semiconductor device structure of claim 19, wherein a bottom surface of the at least one of the oxide and nitride spacers is lower than an upper surface of the PFET source/drain regions.

* * * * *